(12) United States Patent  
McCabe et al.

(10) Patent No.: US 6,556,020 B1
(45) Date of Patent: Apr. 29, 2003

(54) BATTERY STATE OF CHARGE INDICATOR

(75) Inventors: Paul Patrick McCabe, Binghamton, NY (US); Dean Harvey, Courtland, NY (US); Daniel Robert Driscall, Greene, NY (US); Augustus R. Baldini, Binghamton, NY (US)

(73) Assignee: The Raymond Corporation, Greene, NY (US)

( * ) Notice: Subject to any disclaimer, the term of this patent is extended or adjusted under 35 U.S.C. 154(b) by 0 days.

(21) Appl. No.: 10/115,107

(22) Filed: Apr. 2, 2002

(51) Int. Cl.$^7$ .............................................. G01N 27/416
(52) U.S. Cl. ...................................... 324/426; 320/132
(58) Field of Search ................................. 320/132, 149; 324/426, 427, 430, 433, 434

(56) References Cited

U.S. PATENT DOCUMENTS

| | | | |
|---|---|---|---|
| 3,946,299 A | | 3/1976 | Christianson |
| 4,021,718 A | | 5/1977 | Konrad |
| 4,258,306 A | | 3/1981 | Bourke |
| 4,333,149 A | | 6/1982 | Taylor |
| 4,396,880 A | * | 8/1983 | Windebank |
| 4,433,294 A | | 2/1984 | Windebank |
| 4,460,870 A | * | 7/1984 | Finger |
| 5,119,011 A | | 6/1992 | Lambert |
| 5,365,453 A | | 11/1994 | Startup |
| 5,404,106 A | | 4/1995 | Matsuda |
| 5,519,304 A | | 5/1996 | Andrieu |
| 5,691,621 A | | 11/1997 | Phuoc |
| 5,705,929 A | | 1/1998 | Caravello |
| 5,796,239 A | | 8/1998 | Phuoc |
| 6,037,778 A | | 3/2000 | Makhija |
| 6,124,701 A | | 9/2000 | McDowell |
| 6,163,132 A | | 12/2000 | Higuchi |
| 6,285,163 B1 | * | 9/2001 | Watanabe et al. |

* cited by examiner

Primary Examiner—Edward H. Tso
(74) Attorney, Agent, or Firm—Quarles & Brady, LLP

(57) ABSTRACT

A state-of-charge indicator system monitors the battery current and voltage during operation of a lift truck. Selected current and voltage samples are used to calculate the internal battery resistance and this is employed to calculate a "dynamic" battery voltage. This dynamic battery voltage is used as input to a stored look-up table which provides a battery state-of-charge value.

13 Claims, 4 Drawing Sheets

BATTERY STATE OF CHARGE INDICATOR

BACKGROUND OF THE INVENTION

The field of the invention includes methods and means for indicating the remaining charge on a battery, and particularly, the state-of-charge of a lead-acid battery used to power electric lift trucks and the like.

Electric lift trucks employ large lead-acid batteries to power their traction and lift drives. Trucks are typically operated in continuously and when the battery becomes discharged, it is replaced and the truck is immediately put back into service. In a warehouse serviced by many such trucks, batteries continuously cycle through stages including: recharging (typically 7 to 8 hours); cool down period (typically 7 to 8 hours); and use (typically 7 to 8 hours). Because recharging the battery in a truck can take the truck out of service for a period of time, an objective in this industry is to operate the truck as long as possible on a battery charge. To do this, however, one must accurately know the state-of-charge of the battery.

Because a wide variety of different batteries may be used in an industrial lift truck, methods which rely on knowledge of the particular battery to measure its state-of-charge are not practical. Some of the battery variables common to batteries used in a fleet of lift trucks includes voltage (e.g. 24, 36 or 48 volts), their capacity (e.g. from 21.5 kWh to 43 kWh), their temperature (−10° C. to +45° C.) and their condition (e.g. new/old, sulfated, leaky). Each battery is made of a number of cells connected in series to achieve the desired voltage. For example, a 24 v battery has twelve 2 volt cells in series, a 36V battery has 18 cells and a 48V battery has 24 cells. The capacity of a battery is determined by the number and size of plates per 2V cell. If more plates are used the capacity is increased and the internal resistance is decreased. Battery temperature affects the rate of the chemical reaction in a battery cell. This affects the ability of a battery to deliver current and it manifests itself as a change in battery resistance and a change in its effective capacity.

When a battery ages or is not maintained properly, the lead plates become "sulfated". Deposits of lead sulfate form on the plates and do not disappear when the battery is charged. These deposits effectively reduce the active area of each plate and consequently reduce the battery capacity and increase internal resistance. State-of-charge methods which rely on battery capacity as a known value will be very inaccurate unless the condition of the battery is carefully maintained.

Two practices are employed with lift trucks that further complicate measuring the state-of-charge of their batteries. First, it is common practice to partially recharge the truck battery at moments during the work day when it is not in use. Such moments occur, for example, when the operator takes a short break for lunch or the like. And second, such partial recharging also occurs when the lift truck traction drive employs regenerative braking. This is a form of dynamic braking where the traction motor is momentarily turned into a generator. The current which is produced flows into the battery to partially recharge it, and the same current produces a negative torque which opposes travel. While each braking event may only yield 1 watt-hour of energy, the event may occur 600 times during a work shift. State-of-charge indicators which do not account for such intermittent recharging are very inaccurate and result in taking a truck out of service 30 minutes or more before it is necessary.

There are many different techniques for measuring state-of-charge of a battery. One of the simplest methods is to measure battery voltage. Indicating state-of-charge by monitoring battery voltage can work in applications where the load on the battery is constant, but in an application such as a lift truck where the load (and consequently battery voltage), varies widely and unpredictably, the result is inaccurate. The accuracy can be improved by averaging voltage readings over a period of time, but the 30 to 60 minutes required to average out sudden changes in load is too long in most applications.

A number of more complex state-of-charge measurement methods are known. These methods are applicable when considerable information is known about the battery and its use. Such methods may require information such as the capacity of the battery, its temperature, or the specific gravity of its electrolyte. These methods are appropriate in applications in which the same or an identical battery is always used with the state-of-charge indicator circuit.

SUMMARY OF THE INVENTION

The present invention is a method and apparatus for measuring and indicating state-of-charge of a battery while the battery is in use powering a vehicle or other variable load. More particularly, the battery voltage and battery current delivered to the device are sampled during operation and internal battery resistance is calculated from selected voltage and current samples. A dynamic battery voltage is calculated from the measured voltage and current and the calculated internal battery resistance; and this calculated dynamic battery voltage value is used to determine a state-of-charge value for the battery. A stored look-up table is used to convert the dynamic battery voltage to a state-of-charge value, and this table can be used with a wide variety of lead-acid batteries.

A general object of the invention is to accurately determine the state-of-charge of a battery while it is in use with a variable load. The battery voltage and current are sampled periodically during use, and selected samples are used to make the calculations. Factors such as battery capacity, temperature or condition do not affect the results, and do not, therefore, need to be known inputs to produce accurate results.

Another object of the invention is to produce a state-of-charge value which accurately reflects intermittent battery recharging during its sue. The method does not require that the battery only be discharged during use and it does pick up the charge added by events such as regenerative braking.

A more specific object of the invention is to provide a state-of-charge indicator for an industrial truck which may employ a wide range of lead-acid batteries. The present invention provides an accurate state-of-charge indication regardless of the manufacturer of the lead acid battery, its voltage, its condition, its capacity, or its temperature.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

GENERAL DESCRIPTION OF THE INVENTION

Figure 4:
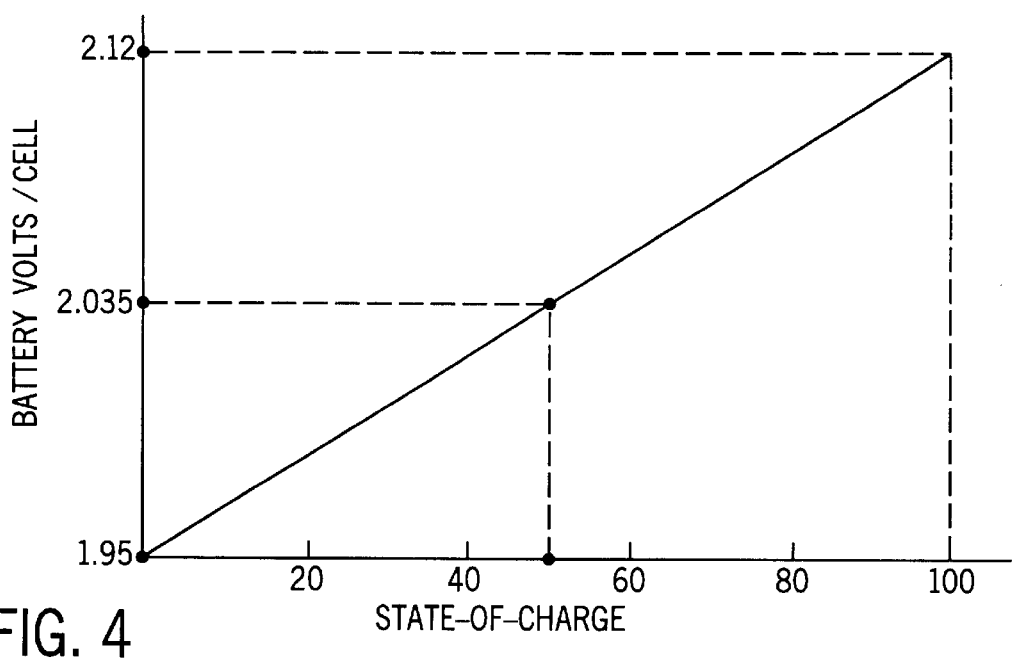
FIG. 4 is a graph which relates open cell voltage to state-of-charge.

The state-of-charge of a lead-acid battery can be determined from its stabilized "open cell" voltage. This voltage can be measured by allowing the battery to remain idle for several hours and then measuring its voltage with no load attached. A chart, or look-up table, such as that illustrated in FIG. 4 is used to convert the measured open cell voltage to a state-of-charge value. Such charts are provided by battery manufacturers. Since the stabilized open cell voltage cannot be measured while the battery is in use, another strategy must be used to determine state-of-charge in real-time applications such as a lift truck.

It is a discovery of the present invention that a "dynamic" battery voltage can be calculated from selected battery voltage and current measurements made during its use, and this dynamic battery voltage can be used to determine a state-of-charge value. It is another discovery of the present invention that a single stored algorithm or look-up table can be used to determine state-of-charge for all lead-acid batteries from the measured dynamic battery voltage.

Figure 5:
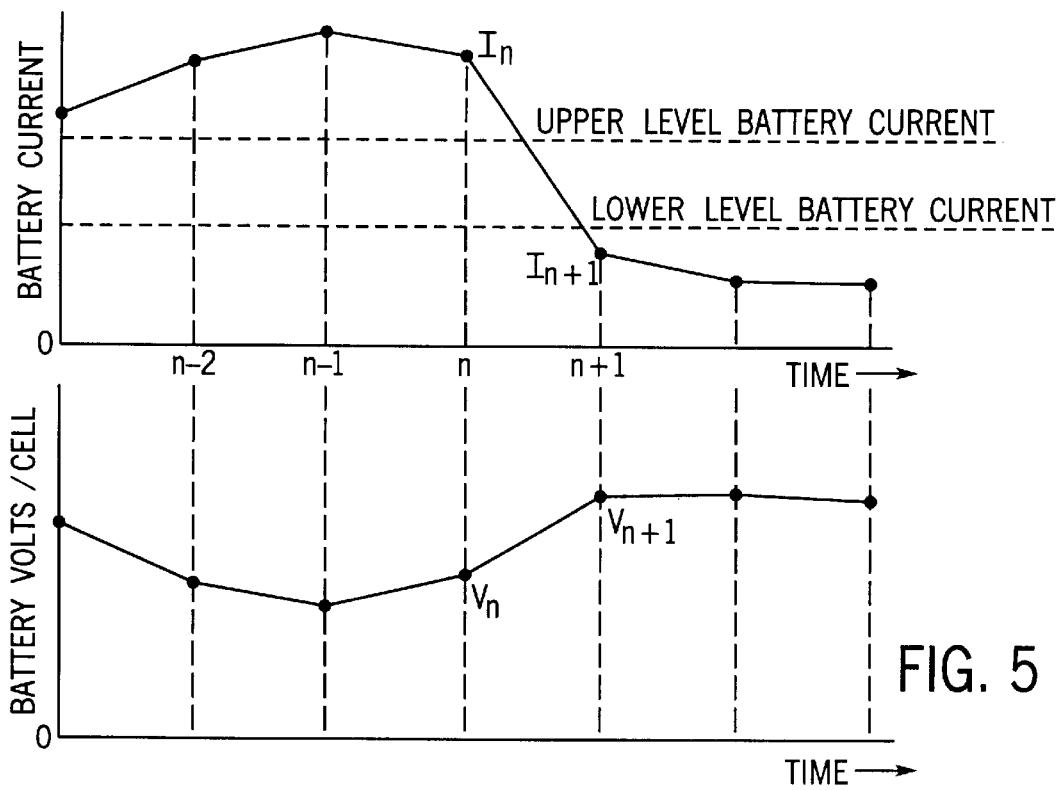
FIG. 5 is a graphic representation of typical battery voltage and current variations during the operation of a lift truck.

The first step is to measure battery voltage and current during battery use and identify selected moments during which the current load on the battery suddenly drops. This is illustrated in FIG. 5 where battery current is sampled at time intervals and a drop in current is detected between sample n and sample n+1. Battery voltage is also sampled at the same time intervals, and when a qualifying event is detected, the voltage and current values at samples n and n+1 are saved. A qualifying event is defined by setting an upper battery current level which must be exceeded and a lower battery current level which is reached in one sample period. Such events occur often during the operation of a lift truck when the traction drive or hoist drive is decelerated or stopped.

The internal battery resistance is calculated using the following formula:

$$R_{battery} = \frac{|V_n - V_{n+1}|}{I_n - I_{n+1}} \quad (1)$$

where V and I are the samples acquired at intervals n and n+1. The dynamic battery voltage is then calculated at the sample interval n+1 using the following formula:

$$V_{dynamic} = V_{n+1} + I_{n+1}(R_{battery}). \quad (2)$$

The dynamic battery voltage is then used to look up state-of-charge value in a stored table, and this value is output to a display. The look-up table is set forth in Appendix A.

The look-up table is empirically derived. Over 100 different lead-acid batteries were charged and then discharged under test conditions. At different states of discharge, the dynamic voltage $V_{dynamic}$ was measured as described above. The battery was then left idle for over 5 hours and its open cell voltage was measured to determine its state-of-charge using the manufacturer's state-of-charge curve for the particular battery. In this manner, the calculated dynamic voltage measurements were correlated with actual battery state-of-charge.

Analysis of the dynamic voltage verses state-of-charge data for each battery revealed that it was virtually the same for all the batteries on a "per cell" basis. That is, when the variable number of cells in batteries are removed from the picture by looking at the dynamic voltage produced by the battery in each of its cells, the state-of-charge reading is virtually the same for all lead-acid batteries. Under normal conditions (e.g., the battery is charged for 8 hours, cooled for 8 hours and driven throughout a discharge cycle) the state-of-charge indication using this look-up table was accurate to within 5% for all the tested lead-acid batteries.

While in theory a single set of voltage and current samples acquired during a single qualifying event is sufficient to determine the battery state-of-charge, in practice the accuracy of the method is increased by averaging a set of the most recent values. More particularly, the most recent values of the calculated internal battery resistance $R_{battery}$ are averaged for use in equation (2), and the most recent values of the calculated dynamic voltage $V_{dynamic}$ are averaged and used to look up the battery state-of-charge.

DESCRIPTION OF THE PREFERRED EMBODIMENT

Figure 1:
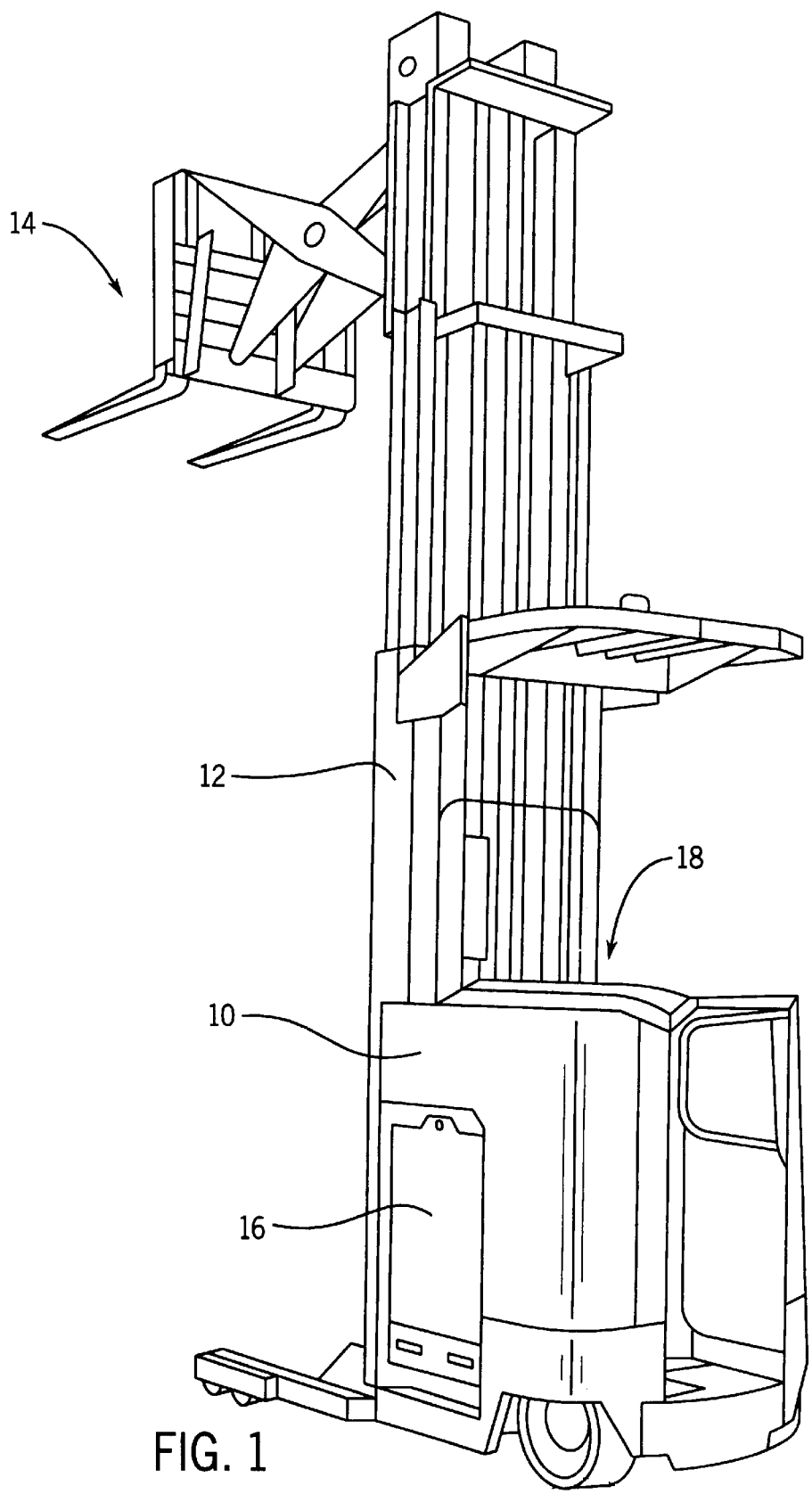
FIG. 1 is a pictorial drawing of a lift truck which employs the preferred embodiment of the invention.

Referring particularly to FIG. 1, a lift truck includes a tractor 10 which supports a vertical mast 12. The tractor 10 includes a traction motor (not shown) which propels the truck and a hoist motor (not shown) which lifts and lowers a set of forks 14 carried by the mast 12. These motors and other electrically powered devices on the lift truck are powered by a lead-acid battery 16 housed in the tractor 10.

The batteries used in lift trucks come in various voltages and capacities. The voltages range from 24 to 48 volts and the typical capacities of commercially available batteries are as follows:

24V 4 to 32 kWh
36V 16 to 54 kWh
48V 22 to 43 kWh.

Because the trucks may be operated in refrigerated warehouses or in un-air conditioned warehouses in hot climates, the batteries operate over a wide temperature range of from −10° C. to +45° C. The trucks are often used continuously over multiple 8 hour shifts and batteries are replaced often from a stockpile of batteries which continuously cycle from use, to recharge, to cooling off.

The present invention produces a state-of-charge value on a display in the operator compartment 18 in the form of a percentage of full charge. When the display indicates a low charge (e.g., 20%) the operator drives the truck to a location where the battery 16 can be replaced with ta fully charged battery.

Figure 2:
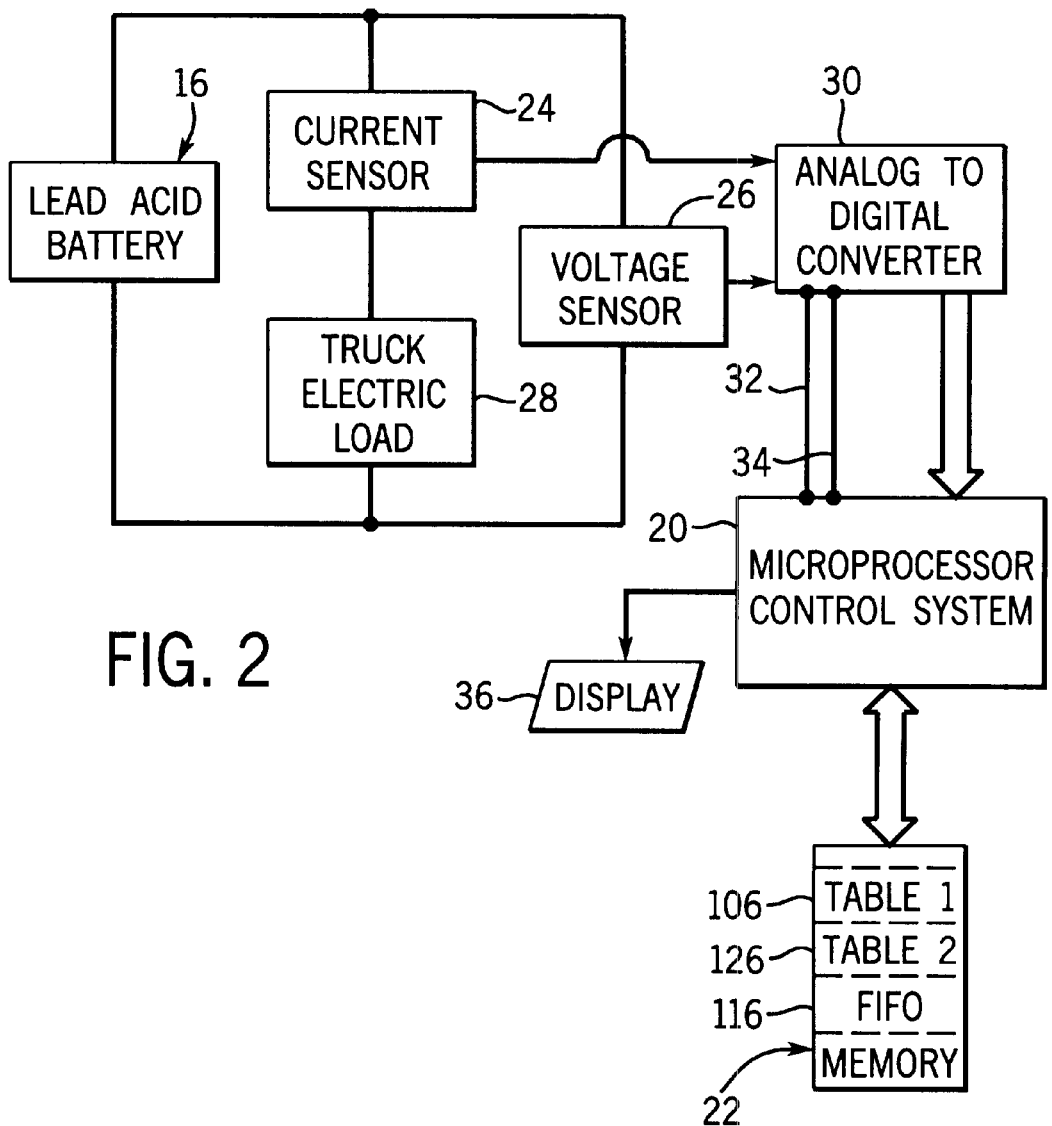
FIG. 2 is an electrical block diagram of a circuit which is employed in the lift truck of FIG. 1 to indicate state-of-charge of its battery.

Referring particularly to FIG. 2, the electrical components on the tractor 10 are controlled by a microprocessor control system 20. Such control systems 20 vary in their particular architecture and features, but they typically contain a microprocessor that receives digitized inputs and that operates in a response to programs stored in a memory 22 to produce outputs that control the traction motor drive, hoist motor drive and other electrical components in the truck. Such a truck control system is disclosed, for example, in U.S. Pat. No. 4,942,529.

Referring still to FIG. 2, the state-of-charge indicator system monitors the state of the battery 16 and includes a current sensor 24 and a voltage sensor 26. The current sensor 24 may be a shunt resistor which is connected in series with the battery load 28. The voltage drop across this precision resistor is proportional to the battery current delivered to the truck components, and this voltage is applied to one analog input on a 10-bit analog-to-digital converter 30. In the alternative, an inductive current transducer may be placed around one of the battery leads to produce a voltage proportional to current flow through the lead. The voltage sensor 26 is connected directly across the battery terminals, and it produces a voltage which is proportion to the battery voltage. In the preferred embodiment the voltage sensor 26 is two series-connected resistors which act as a voltage divider to drop the battery voltage into the range of the analog-to-digital converter 30. This battery voltage signal is applied to a second analog input on the analog-to-digital converter 30.

During truck operation as will be described below, the control system 20 periodically samples battery current and voltage by reading in from the A/D converter 30 a digitized battery current value and a digitized battery voltage value. This is done by selecting one analog input or the other through a control line 32 and then enabling sample control line 34. As will now be explained in detail, these motor current and voltage samples are processed by the control system 20 to produce a state-of-charge value that is output to a display device 36 located in the operator compartment 18.

Figure 3:
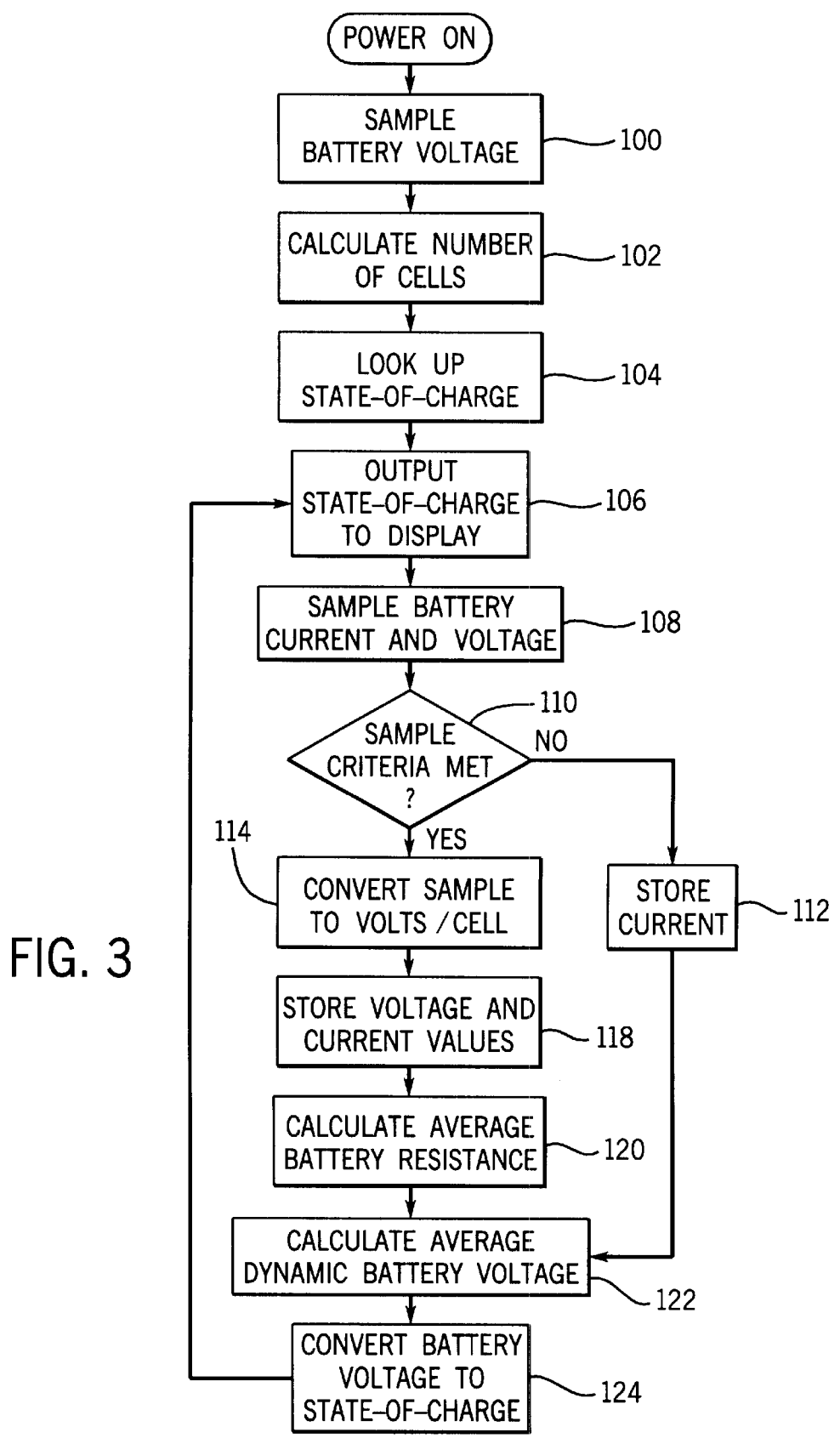
FIG. 3 is a flow chart of the program performed by the microprocessor in FIG. 2 to practice the preferred embodiment of the invention.

Referring to FIG. 3, when the truck is first powered on, the battery voltage is sampled as indicated at process block 100 before significant load is applied. If the battery has been idle for a significant period of time, this measurement accurately indicates the open cell voltage of the battery. As indicated at process block 102, the number of two volt cells in the battery are then calculated by dividing the measured voltage by 2 and rounding off the result to the nearest integer. This number of cells is used throughout the following procedure to reduce all battery voltages to a per cell value. This enables the method to be used with batteries having different voltages (e.g., 24V, 36V and 48V).

As indicated at process block 104, the next step is to look up the state-of-charge of the battery using the per cell open cell, voltage in a table 106 stored in memory 22 (FIG. 2). This first table 106 is a typical table provided by battery manufacturers to relate open cell voltage to battery state-of-charge. The output is a percentage value from 0% to 100% which is output to the display 36 as indicated by process block 106.

A measurement loop is entered after this initial measurement of battery voltage. This loop is executed once every second and the battery voltage and current are sampled and the displayed state-of-charge value is updated. More specifically, battery current and voltage are first sampled at process block 108. As described above, this is accomplished by selecting each analog input of the A/D converter 30 and reading each digitized value into the microprocessor control system 20.

The current measurements are then examined at decision block 110 to determine if a sufficient drop in battery current has occurred since the last one second sample period to meet the preset criteria. In the preferred embodiment the criteria is that the most recently acquired current measurement is less than 100 amperes and the previously acquired current measurement was greater than 175 amperes. If this condition is not present, the most recent current measurement is saved at process block 112 for use during the next pass through the measurement loop. If the criteria is met, the sampled battery voltage is converted to a per cell value at process block 114 and the voltage and current values are stored in a FIFO event table 116 (FIG. 2) as indicated by process block 118. The FIFO event table 116 stores the last 900 such detected and measured events and when a new event is stored therein, the oldest event is discarded. Each stored event includes two, battery cell voltage values $V_n$ and $V_{n+1}$ and two current values $I_n$ and $I_{n+1}$.

Referring still to FIG. 3, the next step as indicated at process block 120 is to calculate the average battery internal resistance $R_{avg}$. This is done by first calculating the internal battery resistance using the most recently acquired voltage and current values:

$$R_{battery} = |V_n - V_{n+1}| / (I_n - I_{n-1}).$$

This resistance value is stored in the event FIFO 116 and it is averaged with the 899 previously measured resistance values:

$$R_{avg} = \sum_{N=0}^{900} R_N / 900.$$

As indicated at process block 122, the average dynamic battery voltage $V_{avg}$ is then calculated. This is done by first calculating the dynamic battery voltage using the most recently acquired voltage and current values and the average battery resistance value:

$$V_{dynamic} = V_{n+1} + I_{n+1}(R_{avg}).$$

The dynamic voltage value is stored in the event FIFO 116 and it is averaged with the 899 previously measured values:

$$V_{avg} = \sum_{N=0}^{900} V_{dynamic_N} / 900.$$

It should be apparent to those skilled in the art that the choice of one second sample periods and the averaging over 900 detected events is application specific. These values are optimal for indicating state-of-charge of industrial truck batteries, but the method may also be optimized to other applications of lead-acid batteries. In such cases different sample periods and averaging numbers would likely be employed.

The last step as indicated at process block 124 is to convert the average dynamic battery voltage $V_{avg}$ to a corresponding battery state-of-charge percentage. This is done by using a second stored look-up table 126 stored in the memory 22. as discussed above, this look-up table 126 was emperically derived using over 100 lead-acid batteries (see Appendix A). The average dynamic voltage $V_{avg}$ is used as an input to this stored table 126 and the corresponding state-of-charge value is read out and output to the display 36 as indicated at process block 106.

The state-of-charge indicator system operates continuously as the lift truck performs its duties. The operator is thus provided with a continuous, up-to-date indication of the battery state-of-charge. Tests indicate an accuracy of ±5% under normal operating conditions and the operator can thus safely operate the truck for nearly the entire charge of the battery.

APPENDIX A

| CELL VOLTAGE | STATE-OF-CHARGE |
| --- | --- |
| 2.1 | 95 |
| 2.09 | 90 |
| 2.081 | 85 |
| 2.072 | 80 |
| 2.063 | 75 |
| 2.054 | 70 |
| 2.049 | 65 |
| 2.044 | 60 |
| 2.037 | 55 |
| 2.032 | 50 |
| 2.027 | 45 |
| 2.021 | 40 |
| 2.013 | 35 |
| 2.005 | 30 |
| 1.997 | 25 |
| 1.988 | 20 |
| 1.978 | 15 |
| 1.966 | 10 |
| 1.952 | 5 |
| 1.936 | 0 |

What is claimed is:

1. A state-of-charge indicator system for a battery which comprises:

a voltage sampling circuit coupled to the battery to measure its voltage;

a current sampling circuit coupled to the battery to measure its current;

battery resistance calculations means coupled to the voltage and current sampling circuits and being operable to calculate a battery resistance value ($R_{battery}$) based on a change in measured battery current and the corresponding change in battery voltage;

dynamic voltage calculation means for receiving measured battery current (1) and voltage (V) and calculated battery resistance ($R_{battery}$) and calculating a dynamic battery voltage $$V_{dynamic} = V + I(R_{battery});$$

and means for converting the dynamic battery voltage $V_{dynamic}$ into a battery state-of-charge value.

2. The system as recited in claim 1 in which the battery is a lead-acid battery and the means for converting is a look-up table stored in a memory.

3. The system as recited in claim 1 which includes:

means for detecting a selected change in battery current and in response thereto, enabling the battery resistance calculation means to calculate the battery resistance value.

4. The system as recited in claim 3 in which the battery is a lead-acid battery and the means for converting is a look-up table stored in a memory.

5. The system as recited in claim 1 in which the voltage and current sampling circuits measure battery voltage and battery current periodically while the battery is being used to power a device and the system further includes:

means for detecting a selected change in battery current event which occurs during successive measured current samples $I_n$ and $I_{n+1}$ and storing said successive current samples $I_n$ and $I_{n+1}$ and the corresponding measured battery voltage samples $V_n$ and $V_{n+1}$; and the battery resistance calculation means calculates the battery resistance value ($R_{battery}$) from said stored samples:

$$R_{(battery)} = |V_n - V_{n+1}|/(I_n - I_{n+1}).$$

6. The system as recited in claim 5 which includes:

a memory for storing battery current and voltage samples from a set of detected battery current events along with the corresponding calculated battery resistance values $R_{(battery)}$; and means for averaging the stored battery resistance values for use by the dynamic voltage calculation means.

7. The system as recited in claim 6 which includes:

means for storing in the memory the dynamic battery voltage value calculated for each detected current event; and the means for converting includes means for calculating an average dynamic battery voltage from dynamic battery voltage values stored in the memory.

8. The system as recited in claim 7 in which the battery is a lead-acid battery and the means for converting includes a look-up table stored in the memory which relates dynamic battery voltages to state-of-charge values.

9. A method for indicating the state-of-charge of a battery connected to a variable load, the steps comprising:

periodically sampling the battery voltage V;

periodically sampling the battery current I;

detecting a battery current change event in which the sampled battery current changes a preselected amount during successive samples $I_n$ and $I_{n-1}$;

calculating a battery resistance value $$R_{battery} = |V_n - V_{n+1}|/(I_n - I_{n+1});$$

calculating a dynamic voltage value $$V_{dynamic} = V_{n+1} + I_{n+1}(R_{battery});$$

and converting the dynamic voltage value to a battery state-of-charge value.

10. The method as recited in claim 9 in which the dynamic voltage is converted to a battery state-of-charge value by looking up in a stored table the battery state-of-charge value which corresponds to the dynamic voltage value.

11. The method as recited in claim 9 in which the variable load is a lift truck and the method includes:

displaying the state-of-charge value to a lift truck operator.

12. The method as recited in claim 9 which includes:

storing successively calculated battery resistance values; and averaging the stored battery resistance values and using the resulting average battery resistance value to calculate the dynamic battery voltage.

13. The method as recited in claim 9 which includes:

storing successively calculated dynamic battery voltage values; and averaging the stored dynamic battery voltage values and using the resulting average dynamic battery voltage to determine the battery state-of-charge value.

* * * * *